US011594706B2

(12) United States Patent
Shui et al.

(10) Patent No.: US 11,594,706 B2
(45) Date of Patent: Feb. 28, 2023

(54) DISPLAY PANEL, PREPARATION METHOD THEREOF AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yudan Shui, Beijing (CN); Yanping Ren, Beijing (CN); Lian Xiang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 112 days.

(21) Appl. No.: 17/004,117

(22) Filed: Aug. 27, 2020

(65) Prior Publication Data

US 2021/0066658 A1    Mar. 4, 2021

(30) Foreign Application Priority Data

Aug. 29, 2019    (CN) .......................... 201910809482.8

(51) Int. Cl.
*H01L 51/52*    (2006.01)
*H01L 51/56*    (2006.01)
*H01L 27/32*    (2006.01)

(52) U.S. Cl.
CPC .......... *H01L 51/5253* (2013.01); *H01L 51/56* (2013.01); *H01L 27/3246* (2013.01); *H01L 27/3283* (2013.01); *H01L 51/5284* (2013.01)

(58) Field of Classification Search
CPC ....... H01L 51/5253–5256; H01L 51/56; H01L 51/5284; H01L 27/3246; H01L 27/3283
See application file for complete search history.

(56) References Cited

U.S. PATENT DOCUMENTS

2011/0248288 A1* 10/2011 Wu ..................... H01L 27/3244
257/E33.001
2013/0161680 A1    7/2013 Oh et al.
(Continued)

FOREIGN PATENT DOCUMENTS

CN    103178078 A    6/2013
CN    105576000 A    5/2016
(Continued)

OTHER PUBLICATIONS

Office Action for corresponding Chinese Application No. 201910809482.8 dated May 26, 2021.

*Primary Examiner* — Shaun M Campbell
(74) *Attorney, Agent, or Firm* — ArentFox Schiff LLP; Michael Fainberg

(57) ABSTRACT

The disclosure discloses a display panel, a preparation method thereof and a display device. The display panel includes: a base substrate, a plurality of light emitting devices located on the base substrate, and a film packaging structure located on a side, away from the base substrate, of the light emitting devices, wherein the film packaging structure includes a first inorganic packaging film on the side, away from the base substrate, of the light emitting devices, a second inorganic packaging film on the side, away from the light emitting devices, of the first inorganic packaging film, and an organic packaging film between the first inorganic packaging film and the second inorganic packaging film; and the first inorganic packaging film is provided with convex structures at gaps among the light emitting devices, and the organic packaging film is disconnected at the convex structures.

14 Claims, 2 Drawing Sheets

(56) References Cited

U.S. PATENT DOCUMENTS

| | | | |
|---|---|---|---|
| 2014/0014909 A1* | 1/2014 | Lee | ............... H01L 51/5256 |
| | | | 438/34 |
| 2016/0126496 A1 | 5/2016 | Wang et al. | |
| 2017/0373274 A1 | 12/2017 | Kokame | |
| 2018/0190731 A1* | 7/2018 | Park | ............... H01L 27/3244 |
| 2019/0123112 A1* | 4/2019 | Lee | ............... H01L 51/5284 |
| 2019/0207155 A1* | 7/2019 | Lee | ............... H01L 51/56 |
| 2020/0411596 A1* | 12/2020 | Guo | ............... G06F 3/0446 |
| 2021/0050394 A1 | 2/2021 | Zhao et al. | |

FOREIGN PATENT DOCUMENTS

| | | |
|---|---|---|
| CN | 108539043 A | 9/2018 |
| CN | 109994520 A | 7/2019 |
| JP | 2017228480 A | 12/2017 |
| TW | 201136437 A | 10/2011 |
| TW | I503043 B | 10/2011 |

\* cited by examiner

DISPLAY PANEL, PREPARATION METHOD THEREOF AND DISPLAY DEVICE

CROSS-REFERENCE TO RELATED APPLICATION

This application claims priority to Chinese Patent Application No. 201910809482.8, filed on Aug. 29, 2019, which is hereby incorporated by reference in its entirety.

FIELD

The present disclosure relates to the technical field of display, in particular to a display panel, a preparation method thereof and a display device.

BACKGROUND

Organic light emitting diode (OLED) display devices have become the most promising novel display devices in recent years due to the advantages of self-illumination, flexibility, high contrast, light weight and the like. An existing OLED film packaging structure is a three-layer stacked structure composed of two layers of inorganic packaging films and a layer of organic packaging film located between the two layers of inorganic packaging films, wherein the inorganic packaging film is used for blocking water and oxygen. However, the inorganic films for blocking water and oxygen are prone to be damaged, for example, in the case of minor damage, water and oxygen will further invade, consequently, an overall packaging failure of the OLED device is caused, the reliability is reduced, and great loss and waste are caused.

SUMMARY

In view of this, embodiments of the present disclosure provide a display panel, a preparation method thereof and a display device.

A display panel provided by an embodiment of the present disclosure includes: a base substrate, a plurality of light emitting devices located on the base substrate, and a film packaging structure located on a side, away from the base substrate, of the light emitting devices, wherein the film packaging structure includes:
  a first inorganic packaging film on the side, away from the base substrate, of the light emitting devices, wherein the first inorganic packaging film includes convex structures at gaps among the light emitting devices;
  a second inorganic packaging film on a side, away from the light emitting devices, of the first inorganic packaging film; and
an organic packaging film between the first inorganic packaging film and the second inorganic packaging film, wherein the organic packaging film is disconnected at the convex structures.

In a possible implementation mode, according to the above display panel provided by the embodiment of the present disclosure, the first inorganic packaging film includes:
  a first sub-packaging film; and
  isolation structures between the first sub-packaging film and a layer in which the light emitting devices are located;
  wherein the organic packaging film is disconnected at the isolation structures.

In a possible implementation mode, according to the above display panel provided by the embodiment of the present disclosure, the first inorganic packaging film further includes: a second sub-packaging film between the isolation structures and the layer in which the organic light emitting devices are located.

In a possible implementation mode, the above display panel provided by the embodiment of the present disclosure further includes: a pixel defining layer for defining the light emitting devices; wherein the isolation structures are above an area where the pixel defining layer is located, and an orthographic projection of the pixel defining layer on the base substrate covers orthographic projections of the isolation structures on the base substrate.

In a possible implementation mode, according to the above display panel provided by the embodiment of the present disclosure, a distance from surfaces, away from the base substrate, of the isolation structures to a surface, proximate to the isolation structures, of the base substrate is greater than a distance from a surface, away from the base substrate, of the organic packaging film to a surface, proximate to the isolation structures, of the base substrate.

In a possible implementation mode, according to the above display panel provided by the embodiment of the present disclosure, the isolation structures are made from a black matrix material or polyimide.

In a possible implementation mode, according to the above display panel provided by the embodiment of the present disclosure, a thickness of the organic packaging film ranges from 1 µm to 20 µm.

In a possible implementation mode, according to the above display panel provided by the embodiment of the present disclosure, a thicknesses of the second inorganic packaging film ranges from 1 µm to 2 µm.

In a possible implementation mode, a thicknesses of the first sub-packaging film ranges from 1 µm to 2 µm.

In a possible implementation mode, according to the above display panel provided by the embodiment of the present disclosure, a thicknesses of the second sub-packaging film ranges from 1 µm to 2 µm.

Based on the same inventive concept, an embodiment of the present disclosure further provides a preparation method of a display panel, and the method includes:
  providing a base substrate;
  forming a plurality of light emitting devices on the base substrate; and
  forming a film packaging structure including a first inorganic packaging film, an organic packaging film and a second inorganic packaging film in sequence on a side, away from the base substrate, of a layer in which the light emitting devices are located, wherein the first inorganic packaging film includes convex structures at gaps among the light emitting devices, and the organic packaging film is disconnected at the convex structures.

In a possible implementation mode, according to the above preparation method of the display panel provided by the embodiment of the present disclosure, the method further includes: forming a pixel defining layer on the base substrate before the forming the plurality of light emitting devices on the base substrate.

In a possible implementation mode, according to the above preparation method of the display panel provided by the embodiment of the present disclosure, the forming the first inorganic packaging film on the side, away from the base substrate, of the layer in which the light emitting devices are located includes:

forming a first sub-packaging film, isolation structures above an area where the pixel defining layer is located, and a second sub-packaging film in sequence on the side, away from the base substrate, of the layer in which the light emitting devices are located.

In a possible implementation mode, according to the above preparation method of the display panel provided by the embodiment of the present disclosure, the forming the isolation structures on the first sub-packaging film specifically includes:

coating the first sub-packaging film with a layer of a black matrix material or polyimide; and forming the isolation structures by exposing and developing the black matrix material or the polyimide.

Based on the same inventive concept, an embodiment of the present disclosure further provides a display device including the above display panel.

DETAILED DESCRIPTION OF THE EMBODIMENTS

To make the objectives, technical solutions and advantages of the embodiments of the present disclosure clearer, the technical solutions of the embodiments of the present disclosure are described clearly and completely in conjunction with the accompanying drawings of the embodiments of the present disclosure below. Obviously, the described embodiments are a part of the embodiments of the present disclosure, but not all the embodiments. Based on the described embodiments of the present disclosure, all other embodiments obtained by those of ordinary skill in the art without creative work fall within the protection scope of the present disclosure.

Unless otherwise defined, the technical or scientific terms used herein shall have the general meanings understood by those of ordinary skill in the art to which the present disclosure belongs. Terms "first", "second" and similar words used in the specification and claims of the present disclosure do not indicate any order, quantity or importance, but are only used to distinguish different components. Words such as "comprise" or "include" mean that elements or objects used before the words contain elements or objects listed after the words and their equivalents, but do not exclude other elements or objects. Words such as "inner", "outer", "upper" and "lower" are only used to indicate the relative positional relationship. When the absolute position of a described object changes, the relative positional relationship may also change accordingly.

The shapes and sizes of all film layers in the accompanying drawings do not reflect the true scale, but only schematically illustrate the content of the present disclosure.

Figure 1:
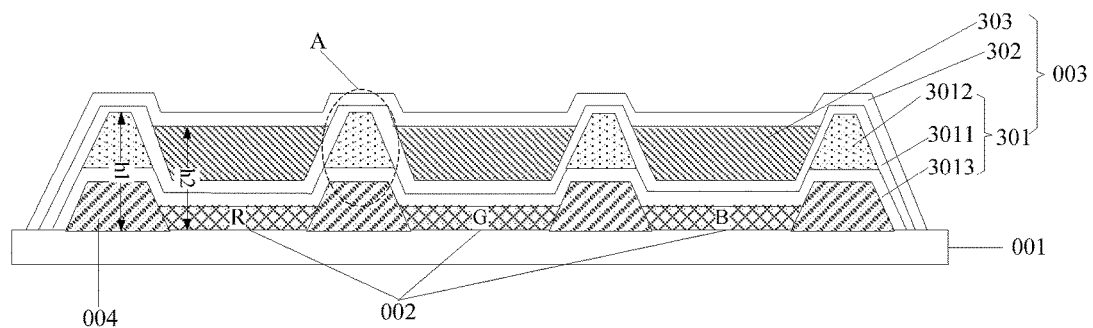
FIG. 1 is a schematic structural diagram of a display panel provided by an embodiment of the present disclosure.

A display panel provided by an embodiment of the present disclosure, as shown in FIG. 1, includes: a base substrate 001, a plurality of light emitting devices 002 located on the base substrate 001, and a film packaging structure 003 located on a side, away from the base substrate, of the light emitting devices 002, wherein the film packaging structure 003 includes a first inorganic packaging film 301 on the side, away from the base substrate, of the light emitting devices, a second inorganic packaging film 302 located on the side, away from the light emitting devices 002, of the first inorganic packaging film 301, and an organic packaging film 303 located between the first inorganic packaging film 301 and the second inorganic packaging film 302; and the first inorganic packaging film 301 includes convex structures A at gaps among the light emitting devices 002, and the organic packaging film 303 is disconnected at the convex structures A.

It should be noted that FIG. 1 exemplarily shows a red light emitting device R, a green light emitting device G and a blue light emitting device B, but in practical application, for example, a white light emitting device may also be included, which is not limited herein.

According to the above display panel provided by the embodiment of the present disclosure, by disconnecting the organic packaging film 303 at the convex structures A, water and oxygen which enter the packaging film structure 003 from tiny breakages are prevented from diffusing in the whole layer of organic packaging film 303, an overall packaging failure caused by the tiny breakages is eliminated, the packaging reliability of the display panel is improved, and the service life of the display panel is prolonged.

In some embodiments, according to the above display panel provided by the embodiments of the present disclosure, as shown in FIG. 1, the first inorganic packaging film 301 may include a first sub-packaging film 3011 and isolation structures 3012 located between the first sub-packaging film 3011 and a layer in which the light emitting devices 002 are located, and the organic packaging film 303 is disconnected at the isolation structures 3012.

By arranging the isolation structures 3012 between the first sub-packaging film 3011 and the layer in which the organic light emitting devices 002 are located, the convex structures A of the first inorganic packaging film 301 are formed at the isolation structures 3012, so that the organic packaging film 303 is disconnected at the isolation structures 3012, water and oxygen are prevented from diffusing in the whole layer of organic packaging film 303, an overall packaging failure caused by the tiny breakages is eliminated, the packaging reliability of the display panel is improved, and the service life of the display panel is prolonged.

In some embodiments, according to the above display panel provided by the embodiments of the present disclosure, in order to better block water and oxygen and improve the packaging reliability of the display panel, as shown in FIG. 1, the first inorganic packaging film 301 may further include: a second sub-packaging film 3013 located between the isolation structures 3012 and the layer in which the organic electroluminescent devices 002 are located.

In some embodiments, according to the above display panel provided by the embodiments of the present disclosure, in order to prevent the convex structures A from affecting the aperture ratio of the display panel, as shown in FIG. 1, the display panel may further include: a pixel defining layer 004 for defining the light emitting devices 002; and the isolation structures 3012 are located above an area where the pixel defining layer 004 is located, and the orthographic projection of the pixel defining layer 004 on the base substrate 001 covers the orthographic projections of the isolation structures 3012 on the base substrate 001.

In some embodiments, according to the above display panel provided by the embodiments of the present disclosure, in order to prevent the material for making the organic packaging film 303 from overflowing in the preparation process, as shown in FIG. 1, a distance h1 from the surfaces, away from the base substrate 001, of the isolation structures 3012 to a surface, proximate to the isolation structures, of the base substrate 001 is greater than a distance h2 from the surface, away from the base substrate 001, of the organic packaging film to a surface, proximate to the isolation structures, of the base substrate 001.

In some embodiments, according to the above display panel provided by the embodiment of the present disclosure, the isolation structures 3012 may be made from materials with exposure and development capabilities, such as a black matrix material or polyimide.

In some embodiments, according to the above display panel provided by the embodiments of the present disclosure, in order to achieve a good packaging effect, the thickness of the organic packaging film 303 may be 1 μm to 20 μm, and the thicknesses of the second inorganic packaging film 302, the first sub-packaging film 3011 and the second sub-packaging film 3013 may be 1 μm to 2 μm respectively.

In addition, the organic packaging film 303 may be made from an organic material such as acrylic, polyimide, glue or printing ink. The second inorganic packaging film 302, the first sub-packaging film 3011 and the second sub-packaging film 3013 may be made from materials such as silicon oxide, silicon nitride, silicon oxynitride, aluminum oxide or aluminum nitride respectively.

Based on the same inventive concept, an embodiment of the present disclosure provides a preparation method of a display panel. Since the principle of problem solving of the preparation method is similar to the principle of problem solving of the above display panel, the implementation of the preparation method provided by the embodiment of the present disclosure may refer to the implementation of the above display panel provided by the embodiment of the present disclosure, and the repeated parts are not described in detail herein.

Figure 2:
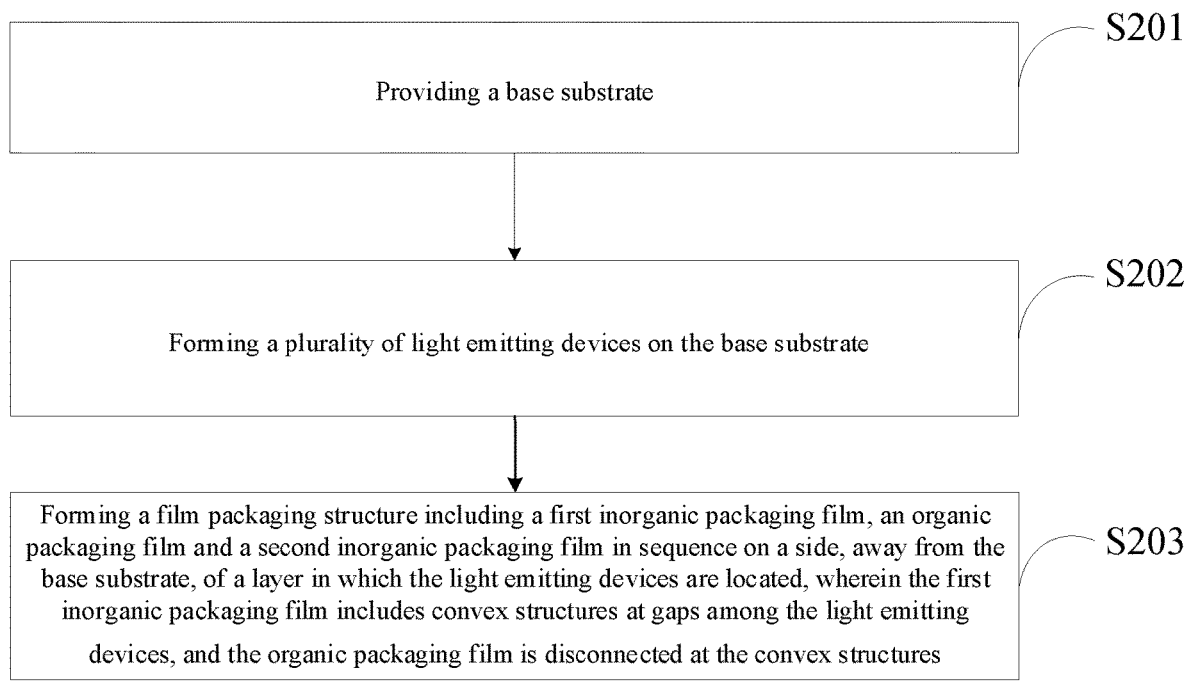
FIG. 2 is a flowchart of a preparation method of a display panel provided by an embodiment of the present disclosure.

As shown in FIG. 2, the preparation method of the display panel provided by the embodiment of the present disclosure may specifically include the following steps.

S201, providing a base substrate.

S202, forming a plurality of light emitting devices on the base substrate.

S203, forming a film packaging structure including a first inorganic packaging film, an organic packaging film and a second inorganic packaging film in sequence on a side, away from the base substrate, of a layer in which the light emitting devices are located, wherein the first inorganic packaging film includes convex structures at gaps among the light emitting devices, wherein the organic packaging film is disconnected at the convex structures.

In some embodiments, according to the above preparation method of the display panel provided by the embodiments of the present disclosure, in order not to affect the aperture ratio of the display panel, before the step S202 of forming a plurality of light emitting devices on the base substrate is preformed, the following steps may also be performed: forming a pixel defining layer on the base substrate.

The step of forming a first inorganic packaging film on the side, away from the base substrate, of the layer in which the light emitting devices are located specifically includes:

forming a second sub-packaging film 3013, isolation structures 3012 located above an area where the pixel defining layer is located, and a first sub-packaging film 3011 in sequence on the side, away from the base substrate, of the layer in which the light emitting devices are located.

In some embodiments, according to the above preparation method of the display panel provided by the embodiments of the present disclosure, the step of forming the isolation structures on the first sub-packaging film specifically may be implemented through the following steps:

coating the second sub-packaging film 3013 with a layer of black matrix material or polyimide; and exposing and developing the black matrix material or polyimide to form the isolation structures 3012.

In order to better understand the technical solutions of the present disclosure, the technical solutions are described in detail below.

Figure 3:
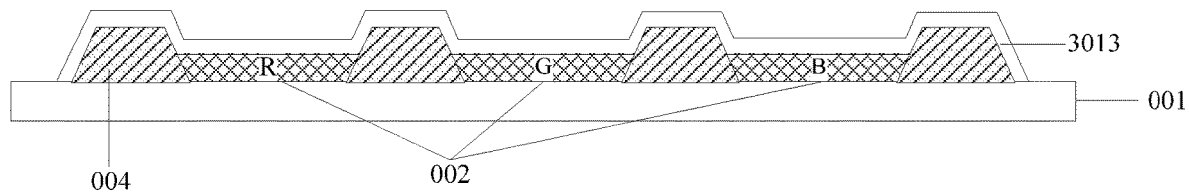
FIG. 3 to FIG. 6 are schematic structural diagrams of a display panel corresponding to respective steps of a preparation method of the display panel provided by an embodiment of the present disclosure.

Step 1: a base substrate 001 is provided, and sequentially, a pixel defining layer 004, light emitting devices 002 and a second sub-packaging film 3013 are formed on the base substrate 001, as shown in FIG. 3; specifically, each light emitting device 002 may include, but may be not limited to a hole injection layer, a hole transport layer, a light emitting layer, an electron transport layer and an electron injection layer (not shown in the figure); and the second sub-packaging film 3013 with the thickness of 1 μm to 2 μm is formed through a chemical vapor deposition (CVD) method or an atomic layer deposition (ALD) method.

Figure 4:
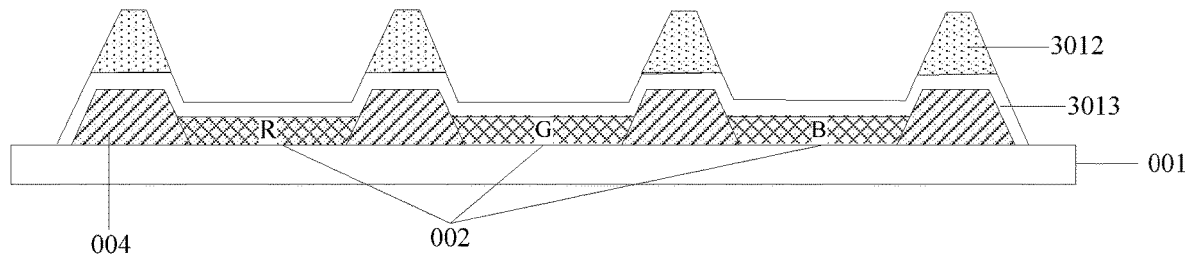

Step 2: the second sub-packaging film 3013 is coated with a material with exposure and development capabilities, such as a black matrix (BM) material, polyimide (PI) or other materials with exposure and development capabilities; and then the above coating material is exposed through a proper mask and then developed so as to form isolation structures 3012 at gaps among the light emitting devices 002, so that the isolation structures 3012 are located above an area where the pixel defining layer 004 is located, and the orthographic projections of the pixel defining layer 004 on the base substrate 001 covers the orthographic projections of the isolation structures 3012 on the base substrate 001, as shown in FIG. 4.

Figure 5:
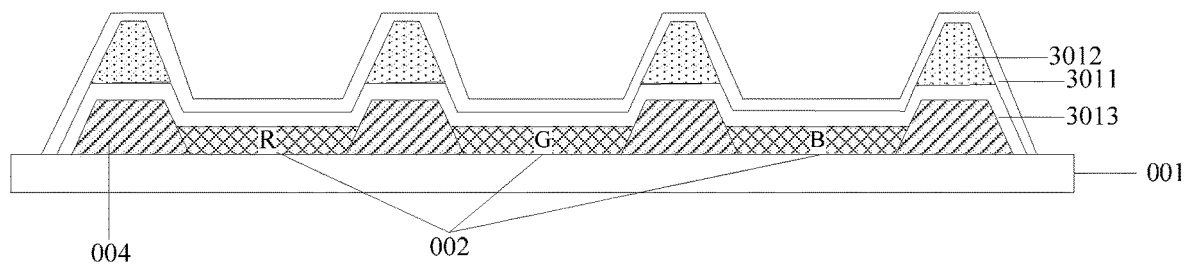

Step 3: a first sub-packaging film 3011 with the thickness of 1 μm to 2 μm is formed by adopting a deposition mode (for example, the chemical vapor deposition method or the atomic layer deposition method), so that the surfaces of the above isolation structures 3012 are covered with the first sub-packaging film 3011 and have the water-oxygen prevention capability, as shown in FIG. 5.

Figure 6:
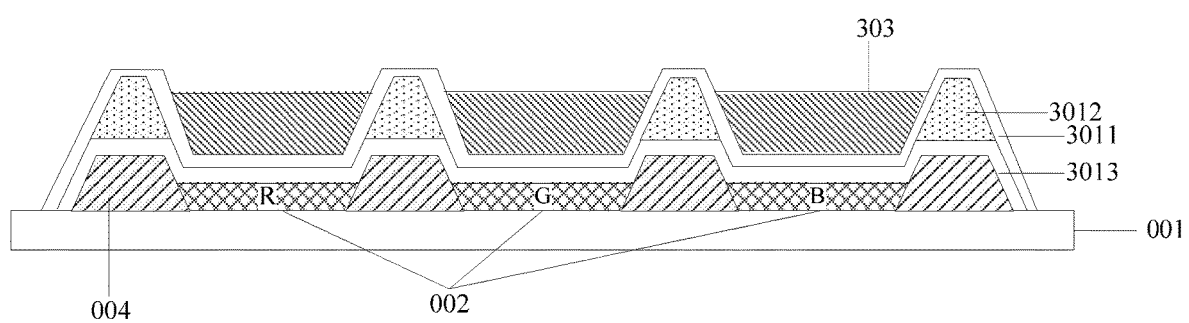

Step 4: an organic packaging film 303 with the thickness of 1 μm to 20 μm is formed by adopting an inkjet printing mode to cover impurities such as particles, and to extend attack paths of water and oxygen, as shown in FIG. 6.

Step 5: a second inorganic packaging film 302 with the water-oxygen prevention capability and the thickness of 1 μm to 2 μm is formed on the organic packaging film 303 by adopting a deposition mode (for example, the chemical vapor deposition method or the atomic layer deposition method), as shown in FIG. 1.

So far, the display panel with the structure shown in FIG. 1 is prepared, and since the organic packaging film 303 is disconnected at the isolation structures 3012, water and oxygen which enter the packaging film structure 003 from tiny breakages are prevented from diffusing in the whole layer of organic packaging film 303, an overall packaging failure caused by the tiny breakages is eliminated, the packaging reliability of the display panel is improved, and the service life of the display panel is prolonged.

Based on the same inventive concept, an embodiment of the present disclosure further provides a display device which includes the above display panel provided by the embodiments of the present disclosure, wherein the display device may be any product or component with a display function, such as a mobile phone, a tablet computer, a television, a display, a notebook computer, a digital photo frame, a navigator, a smart watch, a fitness wristband and a personal digital assistant. Since the principle of problem solving of the display device is similar to the principle of problem solving of the above display panel, the implementation of the display device may refer to the embodiment of the above display panel, and the repeated parts are not described in detail herein.

According to the above display panel, the preparation method thereof and the display device which are disclosed by the present disclosure, the display panel includes: the base substrate, the plurality of light emitting devices located on the base substrate, and the film packaging structure located on the side, away from the base substrate, of the light emitting devices, wherein the film packaging structure includes the first inorganic packaging film on the side, away from the base substrate, of the light emitting devices, the second inorganic packaging film located on the side, away from the light emitting devices, of the first inorganic packaging film, and the organic packaging film located between the first inorganic packaging film and the second inorganic packaging film; and the first inorganic packaging film includes the convex structures at the gaps among the light emitting devices, and the organic packaging film is disconnected at the convex structures. By disconnecting the organic packaging film at the convex structures, water and oxygen which enter the packaging film structure from the tiny breakages are prevented from diffusing in the whole layer of organic packaging film, the overall packaging failure caused by the tiny breakages is eliminated, the packaging reliability of the display panel is improved, and the service life of the display panel is prolonged.

Obviously, those skilled in the art can make various modifications and variations to the present disclosure without departing from the spirit and scope of the present disclosure. In this way, if these modifications and variations to the present disclosure fall within the scope of the claims of the present disclosure and equivalent technologies thereof, the present disclosure is also intended to include these modifications and variations.

What is claimed is:

1. A display panel, comprising:
   a base substrate;
   a plurality of light emitting devices on the base substrate; and
   a film packaging structure on a side, away from the base substrate, of the light emitting devices, wherein the film packaging structure comprises:
   a first inorganic packaging film on the side, away from the base substrate, of the light emitting devices, wherein the first inorganic packaging film comprises convex structures at gaps among the light emitting devices;
   a second inorganic packaging film on a side, away from the light emitting devices, of the first inorganic packaging film; and
   an organic packaging film between the first inorganic packaging film and the second inorganic packaging film, wherein the organic packaging film is disconnected at the convex structures;
   wherein the first inorganic packaging film comprises:
   a first sub-packaging film; and
   isolation structures between the first sub-packaging film and a layer in which the light emitting devices are located;
   wherein the organic packaging film is disconnected at the isolation structures;
   wherein the first inorganic packaging film further comprises:
   a second sub-packaging film between the isolation structures and the layer in which the organic light emitting devices are located; and
   a material of the second sub-packaging film is silicon oxide, silicon nitride, silicon oxynitride, aluminum oxide or aluminum nitride.

2. The display panel according to claim 1, further comprising:
   a pixel defining layer for defining the light emitting devices;
   wherein the isolation structures are above an area where the pixel defining layer is located, and an orthographic projection of the pixel defining layer on the base substrate covers orthographic projections of the isolation structures on the base substrate.

3. The display panel according to claim 1, further comprising:
   a pixel defining layer for defining the light emitting devices;
   wherein the isolation structures are above an area where the pixel defining layer is located, and an orthographic projection of the pixel defining layer on the base substrate covers orthographic projections of the isolation structures on the base substrate.

4. The display panel according to claim 1, wherein a distance from surfaces, away from the base substrate, of the isolation structures to a surface, proximate to the isolation structures, of the base substrate is greater than a distance from a surface, away from the base substrate, of the organic packaging film to a surface, proximate to the isolation structures, of the base substrate.

5. The display panel according to claim 1, wherein a distance from surfaces, away from the base substrate, of the isolation structures to a surface, proximate to the isolation structures, of the base substrate is greater than a distance from a surface, away from the base substrate, of the organic packaging film to a surface, proximate to the isolation structures, of the base substrate.

6. The display panel according to claim 1, wherein the isolation structures are made from a black matrix material or polyimide.

7. The display panel according to claim 1, wherein the isolation structures are made from a black matrix material or polyimide.

8. The display panel according to claim 1, wherein a thickness of the organic packaging film ranges from 1 μm to 20 μm.

9. The display panel according to claim 1, wherein a thicknesses of the second inorganic packaging film ranges from 1 μm to 2 μm.

10. The display panel according to claim 1, wherein a thicknesses of the first sub-packaging film ranges from 1 μm to 2 μm.

11. The display panel according to claim 1, wherein a thicknesses of the second sub-packaging film ranges from 1 μm to 2 μm.

12. A preparation method of a display panel, comprising:
    providing a base substrate;

forming a plurality of light emitting devices on the base substrate; and forming a film packaging structure comprising a first inorganic packaging film, an organic packaging film and a second inorganic packaging film in sequence on a side, away from the base substrate, of a layer in which the light emitting devices are located, wherein the first inorganic packaging film comprises convex structures at gaps among the light emitting devices, and the organic packaging film is disconnected at the convex structures;

forming a pixel defining layer on the base substrate before the forming the plurality of light emitting devices on the base substrate;

wherein the forming the first inorganic packaging film on the side, away from the base substrate, of the layer in which the light emitting devices are located comprises:

forming a second sub-packaging film, isolation structures above an area where the pixel defining layer is located, and a first sub-packaging film in sequence on the side, away from the base substrate, of the layer in which the light emitting devices are located;

wherein a material of the second sub-packaging film is silicon oxide, silicon nitride, silicon oxynitride, aluminum oxide or aluminum nitride.

13. The preparation method of the display panel according to claim 12, wherein the forming the isolation structures on the first sub-packaging film comprises:

coating the first sub-packaging film with a layer of a black matrix material or polyimide; and forming the isolation structures by exposing and developing the black matrix material or the polyimide.

14. A display device, comprising: the display panel according to claim 1.

\* \* \* \* \*